US012112815B2

(12) United States Patent
Yang et al.

(10) Patent No.: US 12,112,815 B2
(45) Date of Patent: Oct. 8, 2024

(54) METHOD AND APPARATUS FOR BATCH TESTING DEVICE, RELATED COMPUTER DEVICE AND MEDIUM

(71) Applicant: CHANGXIN MEMORY TECHNOLOGIES, INC., Hefei (CN)

(72) Inventors: Wei Yang, Hefei (CN); Fang Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 400 days.

(21) Appl. No.: 17/451,337

(22) Filed: Oct. 19, 2021

(65) Prior Publication Data

US 2022/0270699 A1    Aug. 25, 2022

Related U.S. Application Data

(63) Continuation of application No. PCT/CN2021/101707, filed on Jun. 23, 2021.

(30) Foreign Application Priority Data

Feb. 23, 2021   (CN) .......................... 202110200498.6

(51) Int. Cl.
*G11C 29/08*     (2006.01)
*G06F 11/263*    (2006.01)

(52) U.S. Cl.
CPC ............ *G11C 29/08* (2013.01); *G06F 11/263* (2013.01)

(58) Field of Classification Search
CPC ........ G11C 29/08; G11C 29/56; G06F 11/263
See application file for complete search history.

(56) References Cited

U.S. PATENT DOCUMENTS 5,289,113 A *   2/1994  Meaney ................ G06F 11/006
                                                            324/750.04
7,047,463 B1 *  5/2006  Organ ................. G01R 31/2893
                                                            714/724

(Continued)

FOREIGN PATENT DOCUMENTS

CN    102905034 A     1/2013
CN    103713991 A     4/2014

(Continued)

OTHER PUBLICATIONS

International Search Report as cited in PCT/CN2021/101707 mailed Nov. 24, 2021, 10 pages.

*Primary Examiner* — Matthew M Kim
*Assistant Examiner* — Matthew N Putaraksa
(74) *Attorney, Agent, or Firm* — Kilpatrick Townsend & Stockton LLP

(57) ABSTRACT

The present application relates to a method and apparatus for batch testing device, related a computer device and a medium. The method includes: writing a corresponding test identification into each of the devices to be tested, wherein different devices to be tested have different test identifications; acquiring a device identification of each of the devices to be tested and generating a device identification sequence; sending corresponding test cases to the devices to be tested sequentially according to the device identification sequence, so that each of the devices to be tested executes the corresponding test case; and generating a test result for each of the devices to be tested, the test result corresponding to the corresponding test identification.

12 Claims, 12 Drawing Sheets

(56) References Cited

U.S. PATENT DOCUMENTS

| | | | | |
|---|---|---|---|---|
| 7,171,338 | B1* | 1/2007 | Goguen | G06F 11/3414 |
| | | | | 714/E11.193 |
| 7,404,121 | B2* | 7/2008 | Casterton | G01R 31/318314 |
| | | | | 714/724 |
| 8,797,046 | B2* | 8/2014 | Rivoir | G01R 31/31908 |
| | | | | 324/555 |
| 2004/0179413 | A1* | 9/2004 | Lee | G11C 29/56 |
| | | | | 365/201 |
| 2005/0067991 | A1* | 3/2005 | El-Ibiary | H02P 29/664 |
| | | | | 318/561 |
| 2009/0287963 | A1* | 11/2009 | Oglesby | G06F 11/3684 |
| | | | | 714/E11.212 |
| 2009/0313512 | A1 | 12/2009 | Jing et al. | |
| 2013/0166244 | A1* | 6/2013 | Turgeon | H01M 10/44 |
| | | | | 324/426 |
| 2015/0024720 | A1* | 1/2015 | Efrati | H04W 12/02 |
| | | | | 455/414.1 |
| 2016/0103748 | A1* | 4/2016 | Holden | G06F 11/2294 |
| | | | | 714/33 |
| 2019/0215707 | A1* | 7/2019 | Jackson | H04B 17/29 |
| 2020/0075117 | A1* | 3/2020 | Lai | G11C 29/38 |
| 2022/0283920 | A1* | 9/2022 | Tsai | G06F 11/2736 |

FOREIGN PATENT DOCUMENTS

| | | |
|---|---|---|
| CN | 104794034 A | 7/2015 |
| CN | 106683705 A | 5/2017 |
| CN | 106708007 A | 5/2017 |
| CN | 107766185 A | 3/2018 |
| CN | 108519934 A | 9/2018 |
| CN | 108563538 A | 9/2018 |
| CN | 109800123 A | 5/2019 |
| CN | 111813687 A | 10/2020 |
| CN | 111918259 A | 11/2020 |
| CN | 112799958 A | 5/2021 |

* cited by examiner

METHOD AND APPARATUS FOR BATCH TESTING DEVICE, RELATED COMPUTER DEVICE AND MEDIUM

CROSS-REFERENCE TO RELATED APPLICATIONS

This application is a continuation application of International Patent Application No. PCT/CN2021/101707, filed on Jun. 23, 2021, which claims priority to Chinese Patent Application No. 202110200498.6, filed with the Chinese Patent Office on Feb. 23, 2021 and entitled "METHOD AND APPARATUS FOR BATCH TESTING DEVICE, RELATED COMPUTER DEVICE AND MEDIUM." International Patent Application No. PCT/CN2021/101707 and Chinese Patent Application No. 202110200498.6 are incorporated herein by reference in their entireties.

TECHNICAL FIELD

The present application relates to the field of automated testing technologies, and in particular, to a method and apparatus for batch testing device, related a computer device and a medium.

BACKGROUND

With the rapid development of semiconductor and integrated circuit technologies, the demand for chip products is increasing on the market, and requirements on chip suppliers' production efficiency are increasingly higher. In order to improve supply quality of chips, testing capability and testing efficiency of the chips made are required to be continuously improved.

It is difficult to control a plurality of test platforms at the same time by using a conventional chip testing method, which is not suitable for batch testing of chips and includes a test program with poor portability. Moreover, this method has high requirements on capability of communication between a main control device and each platform to be tested, which seriously restricts the capability and efficiency of chip batch testing. How to realize efficient batch testing on the chips made becomes one of the key factors to further improve the supply capability and efficiency of the chip suppliers.

SUMMARY

Based on the above, there is a need to provide a method and apparatus for batch testing device, related a computer device and a medium that can efficiently test devices in batches with respect to the problems in the Background, so as to effectively improve supply efficiency and supply quality of device products.

In order to achieve the foregoing and other objectives, a first aspect of the present application provides a method for batch testing device, for batch testing of a plurality of devices to be tested, the method including:

writing a corresponding test identification into each of the devices to be tested, wherein different the devices to be tested have different test identifications;

acquiring a device identification of each of the devices to be tested and generating a device identification sequence;

sending corresponding test cases to the devices to be tested sequentially according to the device identification sequence, so that each of the devices to be tested executes the corresponding test case; and generating a test result for each of the devices to be tested, the test result corresponding to the corresponding test identification.

A second aspect of the present application provides an apparatus for batch testing device, for batch testing of a plurality of devices to be tested, the apparatus including: a test identification writing module, a device identification sequence generation module, a test case sending module and a test result generation module. The test identification writing module is configured to write a corresponding test identification into each of the devices to be tested, wherein different devices to be tested have different test identifications. The device identification sequence generation module is configured to acquire a device identification of each of the devices to be tested and generate a device identification sequence. The test case sending module is configured to send corresponding test cases to the devices to be tested sequentially according to the device identification sequence, so that each of the devices to be tested executes the corresponding test case. The test result generation module is configured to generate a test result for each of the devices to be tested, the test result corresponding to the corresponding test identification.

A third aspect of the present application provides a computer device, including a memory and a processor, the memory storing a computer program runnable on the processor, wherein steps of the method for batch testing device according to any one of the embodiments of the present application are implemented when the processor executes the program.

A fourth aspect of the present application provides a computer-readable storage medium, having a computer program stored thereon, wherein the computer program, when executed by a processor, implements steps of the method for batch testing device according to any one of the embodiments of the present application.

BRIEF DESCRIPTION OF DRAWINGS

In order to more clearly illustrate the technical solutions in embodiments of the present application, the accompanying drawings used in the description of the embodiments will be briefly introduced below. It is apparent that, the accompanying drawings in the following description are only some embodiments of the present application, and other drawings can be obtained by those of ordinary skill in the art from the provided drawings without creative efforts.

DESCRIPTION OF EMBODIMENTS

Figure 1:
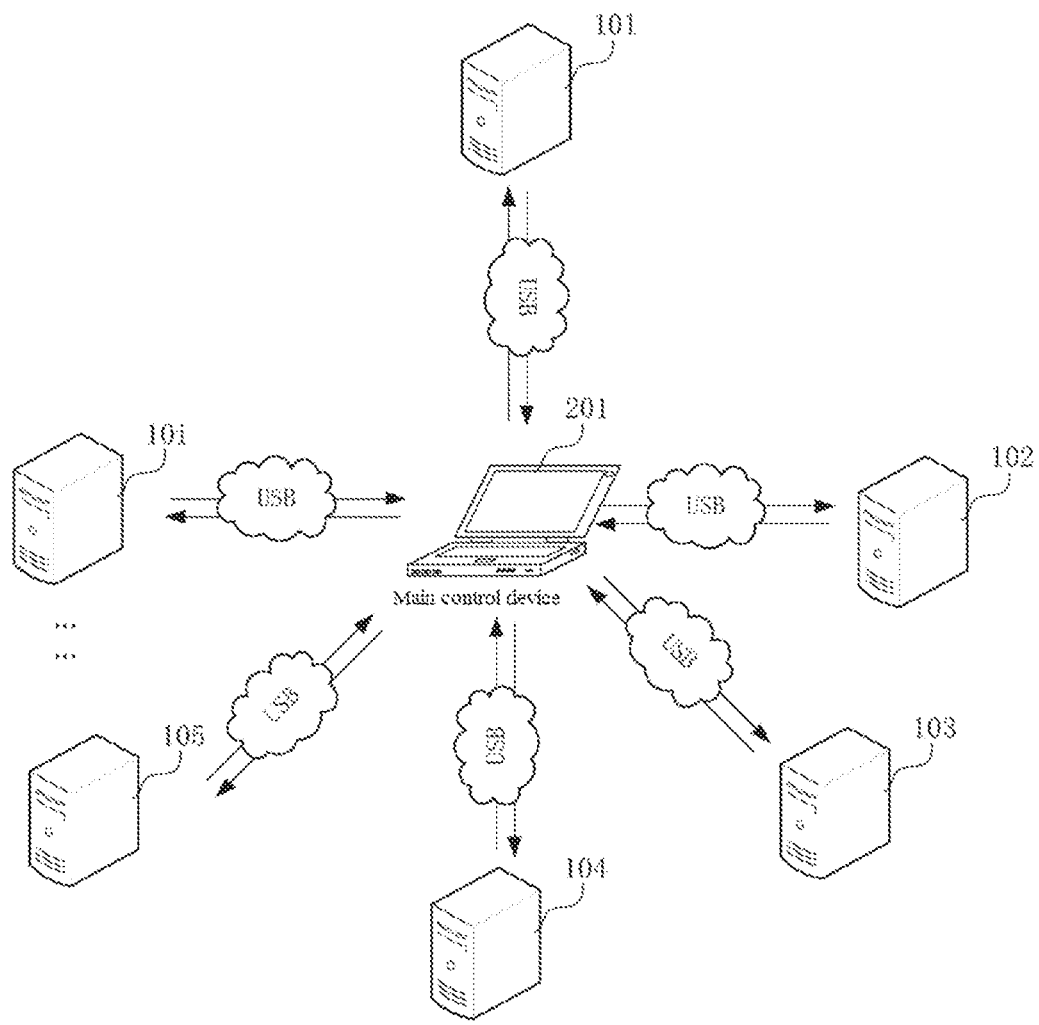
FIG. 1 is a schematic diagram of an application scenario of a method for batch testing device according to a first embodiment of the present application.

To facilitate understanding of the present application, a more comprehensive description of the present application will be given below with reference to the relevant accompanying drawings. Preferred embodiments of the present application are given in the drawings. However, the present application may be implemented in many different forms and is not limited to the embodiments described herein. Rather, these embodiments are provided to make the contents disclosed in the present application understood more thoroughly and fully.

Unless defined otherwise, all technical and scientific terms used herein have the same meanings as would generally understood by those skilled in the technical field of the present application. The terms used herein in the specification of the present application are for the purpose of describing specific embodiments only, and are not intended to limit the present application. In a case where "comprise", "have", and "include" described herein are used, another component may be added unless expressly qualified terms such as "only" and "consist of . . . " are used. Unless otherwise mentioned, the terms of a singular form may include plural forms and cannot be understood as including one.

It may be understood that, the terms such as "first" and "second" may be used herein to describe various elements, but the elements should not be limited to these terms. Such terms are intended only to distinguish one element from another element. For example, without departing from the scope of the present application, a first element may be referred to as a second element, and similarly, the second element may also be referred to as the first element.

Invention motivations and implementation principles of the present application are described with an example in which a Dynamic Random Access Memory (DRAM) chip is tested. In a process of testing and verifying the DRAM chip, some test programs are required to be run at a system level of the test platforms, and a main control computer is required to send a command to each connected test platform to execute the test programs. One computer may be connected to a plurality of test platforms at the same time, and there is a need to know which test platform the command is sent to; therefore, a method for identifying each test platform is needed. Conventional methods for identifying test platforms mainly include the following:

1) making a test program into an application, and directly clicking to run the application in the platform;

2) inputting a command through a command line into the platform and executing the command; and 3) controlling each test platform by using a wireless local area network (Wi-Fi) as an intermediate medium.

Regarding the first method, there is a need to click to run the application, the test platform is required to have a screen, and it is difficult to control a plurality of platforms simultaneously; therefore, for hardware resources of the platform, requirements are high and execution efficiency is low. Regarding the second method, its implementation requires a precondition that the main control computer can identify each test platform. If different platforms are identified through a Universal Asynchronous Transmitter (UART), the test platform is required to have a UART interface, it is difficult to input a command to a plurality of test platforms simultaneously through the UART interface, requirements of large-scale batch testing cannot be met, and the testing method is poor in portability. Regarding the third method, its implementation requires the platform to support Wi-Fi. Applications are required to be written separately and installed into each test platform to receive the command sent by the main control computer through Wi-Fi, and a test state is fed back to the main control computer through Wi-Fi. Test preparation is a heavy workload, and once a Wi-Fi signal is interrupted, a communication signal between the main control computer and each test platform may be lost, and even the test may be interrupted. Therefore, the testing method is still difficult to meet the requirements of large-scale batch testing, especially for DRAM chips.

In view of too many restrictions on the use of the UART interface and Wi-Fi to realize device batch testing, difficult universalization and inconvenience for batch operations, the present application proposes the use of a USB interface to realize information exchange between a main control device and a plurality of test platforms.

As an example, in one embodiment of the present application, a method for batch testing device is provided, for batch testing of a plurality of devices to be tested. The method may be applied to an application environment shown in FIG. 1, for example, applied to a main control device 201. The main control device 201 is connected to a plurality of devices to be tested 10$i$ through a Universal Serial Bus (USB) and configured to realize batch testing on the plurality of devices to be tested, where i is a positive integer greater than or equal to 2. The main control device 201 may be a main control terminal, such as a laptop, a desktop computer or an industrial computer, and configured to control batch testing of the plurality of devices to be tested 10$i$. The device to be tested 10$i$ may be an intelligent electronic product, a memory chip, or the like. For example, the device to be tested 10$i$ may be a DRAM chip.

Figure 2:
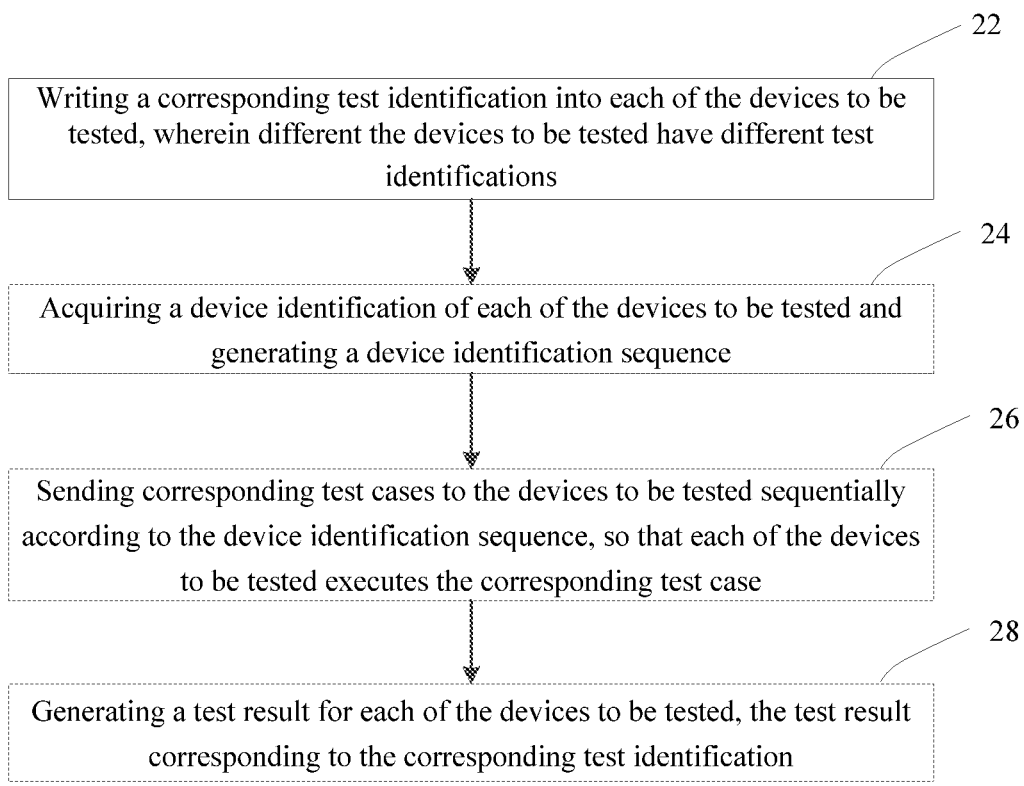
FIG. 2 is a schematic flowchart of a method for batch testing device according to a second embodiment of the present application.

As an example, referring to FIG. 2, in one embodiment of the present application, a method for batch testing device is provided, for batch testing of a plurality of devices to be tested. The method includes the following steps:

Step 22, a corresponding test identification is written into each of the devices to be tested, wherein different devices to be tested have different test identifications.

Step 24, a device identification of each of the devices to be tested is acquired and a device identification sequence is generated.

Step 26, corresponding test cases are sent to the devices to be tested sequentially according to the device identification sequence, so that each of the devices to be tested executes the corresponding test case.

Step 28, a test result for each of the devices to be tested is generated, the test result corresponding to the corresponding test identification.

Specifically, still referring to FIG. 2, a test identification of each of the devices to be tested is pre-designed, wherein different devices to be tested have different test identifications, the test identification may be used as a dedicated test name of the device to be tested, and the test identification may be formed using one or more of a character, a number, a letter and the like; then a corresponding test identification is written into each of the devices to be tested, so as to facilitate subsequent establishment of a mapping relationship between test results for the devices to be tested and the corresponding test identifications; a device identification of each of the devices to be tested is acquired and a device identification sequence is generated, so as to send corresponding test cases to the devices to be tested sequentially according to the device identification sequence, so that each of the devices to be tested executes the corresponding test case, the test cases are compiled according to test requirements under a same batch test automation framework, and at least two devices to be tested correspond to different test cases; thus, a test result of each of the devices to be tested including the corresponding test identification is acquired, which efficiently tests devices in batches to effectively improve supply efficiency and supply quality of device products. In the present application, device identifications of devices to be tested are used as a bridge, a correspondence between test results of the devices to be tested and test identifications written into the devices to be tested is established, and the test results corresponding to the corresponding test identifications are outputted, which has low test costs, high efficiency and good portability.

Figure 3:
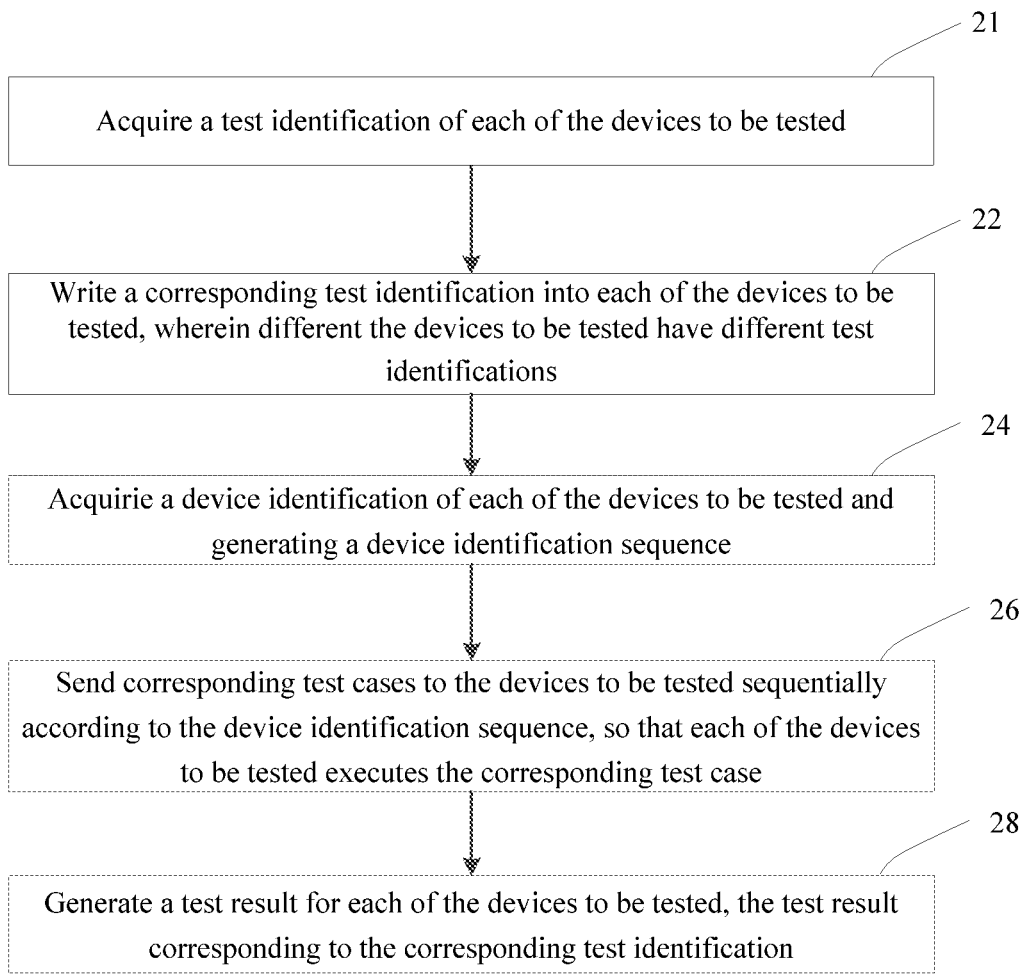
FIG. 3 is a schematic flowchart of a method for batch testing device according to a third embodiment of the present application.

Further, referring to FIG. 3, in one embodiment of the present application, prior to the step of writing a corresponding test identification into each of the devices to be tested, the method further includes the following step:

Step 21, the test identification of each of the devices to be tested is acquired.

As an example, the main control device may be a terminal having an operable interface. An input window or a web page may be displayed on an interface of the main control device. A user may input data through the input window or browse the web page to acquire data stored locally or data stored on a server or other storage devices connected to the main control device over a network. The network application may be a browser or other applications that can display content of the page (such as an industrial software application or an instant messaging application). An input window configured to input the corresponding test identification of the device to be tested may be displayed in the web page. The user may input the corresponding test identification of the device to be tested through the input window and may also paste the corresponding test identification of the device to be tested on a body of the device to be tested, so that the user can intuitively identify each of the devices to be tested. Different devices to be tested have different test identifications, the test identification may be a user-defined test identification, and the test identification may be used as a dedicated test name of the device to be tested and may include one or more of a character, a number, a letter and the like.

Figure 4:
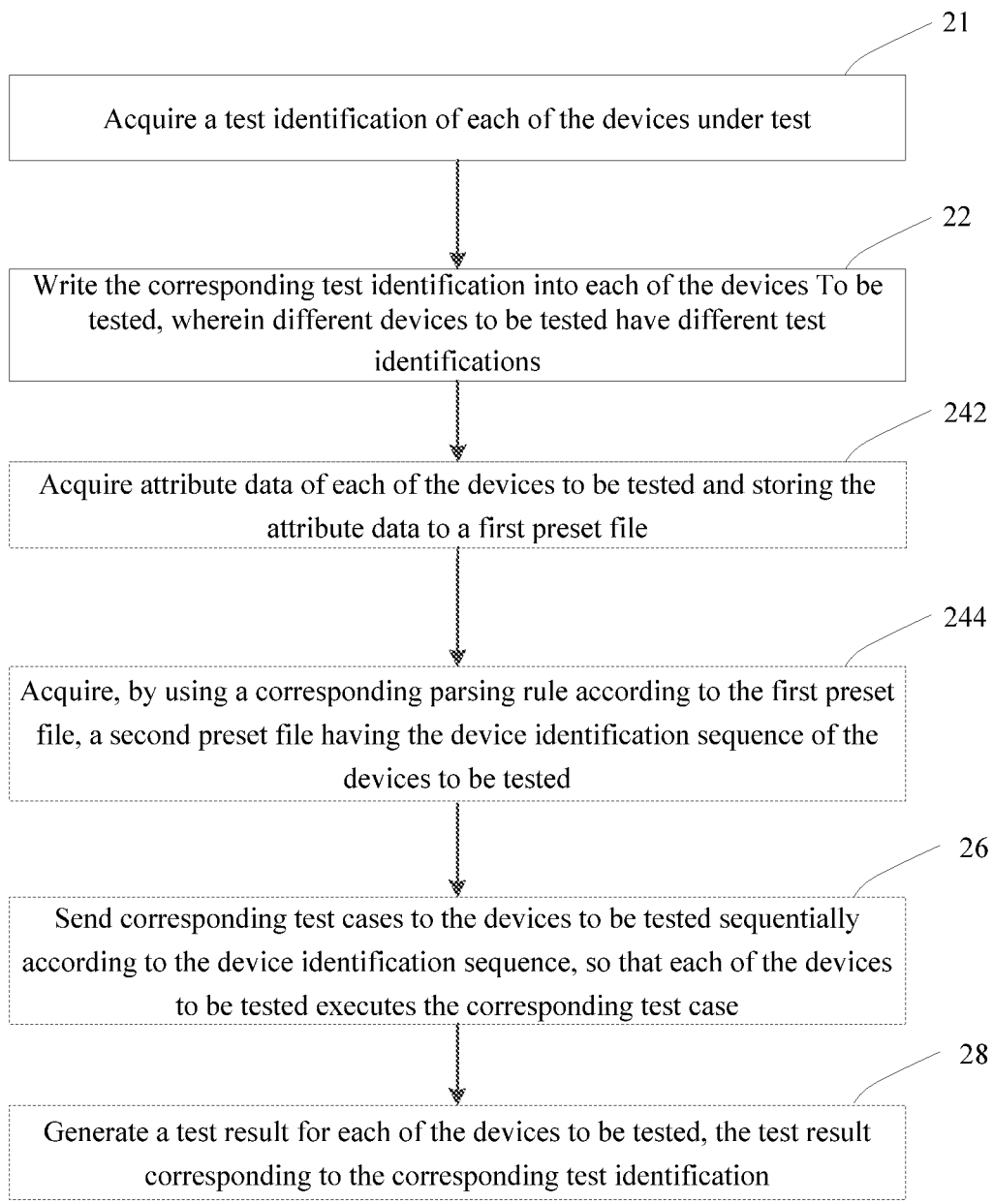
FIG. 4 is a schematic flowchart of a method for batch testing device according to a fourth embodiment of the present application.

Further, referring to FIG. 4, in one embodiment of the present application, the step of acquiring a device identification of each of the devices to be tested and generating a device identification sequence includes the following steps.

Step 242, attribute data of each of the devices to be tested is acquired and the attribute data is stored to a first preset file.

Step 244, a second preset file having the device identification sequence of the devices to be tested are acquired by using a corresponding parsing rule according to the first preset file.

As an example, still referring to FIG. 1 and FIG. 4, when communicatively interconnected with the main control device 201 through a USB, the device to be tested 10*i* may request a temporary number transport_id_i from the main control device 201. Attribute data of all devices to be tested 10*i* connected to the main control device 201 through the USB may be acquired by using a first view command such as an Android Debug Bridge (abd) command, and the attribute data is stored to the first preset file. Then, transport_id_i in the attributed data of the device to be tested 10*i* is parsed to a second preset file by using a corresponding parsing rule according to the first preset file, so as to acquire the second preset file having the device identification sequence of the devices to be tested. In order to facilitate the subsequent use of the device identification transport_id_i of the device to be tested as a bridge, a correspondence between test results of the devices to be tested and test identifications hostname_i written into the devices to be tested is established, and the test results corresponding to the corresponding test identifications hostname_i are outputted, which has low test costs, high efficiency and good portability, where i is a positive integer greater than or equal to 2.

Figure 5:
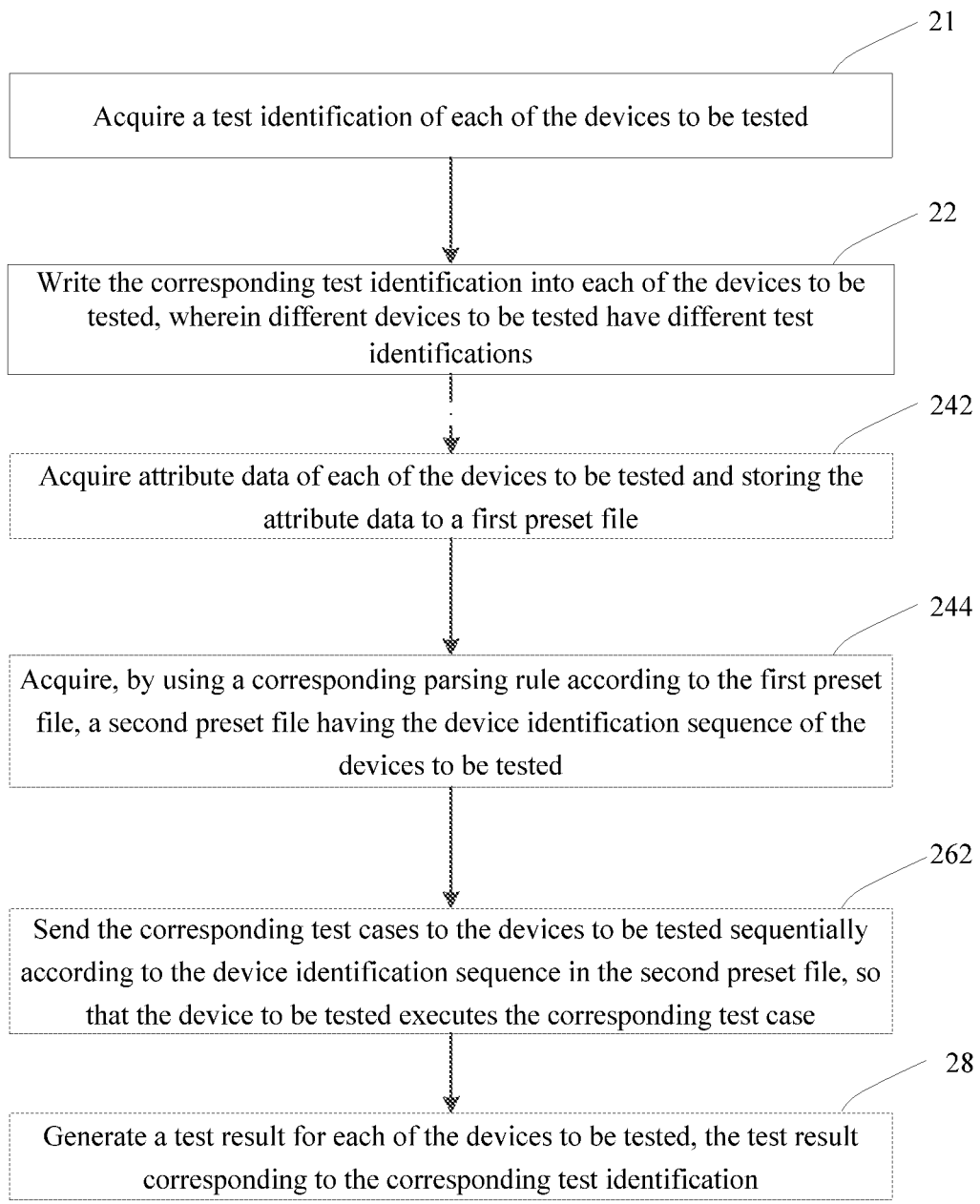
FIG. 5 is a schematic flowchart of a method for batch testing device according to a fifth embodiment of the present application.

Further, referring to FIG. 5, in one embodiment of the present application, the step of sending corresponding test cases to the devices to be tested sequentially according to the device identification sequence includes the following step.

Step 262, the corresponding test cases to the devices to be tested are sent sequentially according to the device identification sequence in the second preset file.

As an example, still referring to FIG. 1 and FIG. 5, when disconnected from the main control device 201 and connected to the main control device 201 again, the device to be tested 10*i* may apply for a different temporary number from the main control device 201; that is, the temporary number is not fixed; therefore, a test result including a fixed number of the device to be tested 10*i* cannot be acquired by fixedly binding the temporary number transport_id_i acquired for the first time to the device to be tested 10*i*, where i is a positive integer greater than or equal to 2. Therefore, a fixed number bound to each of the devices to be tested is required to be acquired to acquire a test result corresponding to the fixed number, which avoids confusion of test results for different devices to be tested and realizes batch testing on a plurality of devices to be tested. After the second preset file having the device identification sequence of the devices to be tested is acquired, the corresponding test cases to the devices to be tested are sent sequentially according to the device identification sequence in the second preset file, so that each of the devices to be tested executes the corresponding test case, making it easy to acquire test results in one-to-one correspondence to the device identification sequence and acquire the test identifications in one-to-one correspondence to the device identification sequence, so as to acquire the test results including the test identifications corresponding to the devices to be tested; that is, test results corresponding to the fixed numbers bound to the devices to be tested are acquired, to effectively avoid confusion of test results for different devices to be tested and realize batch testing on a plurality of devices to be tested.

Figure 6:
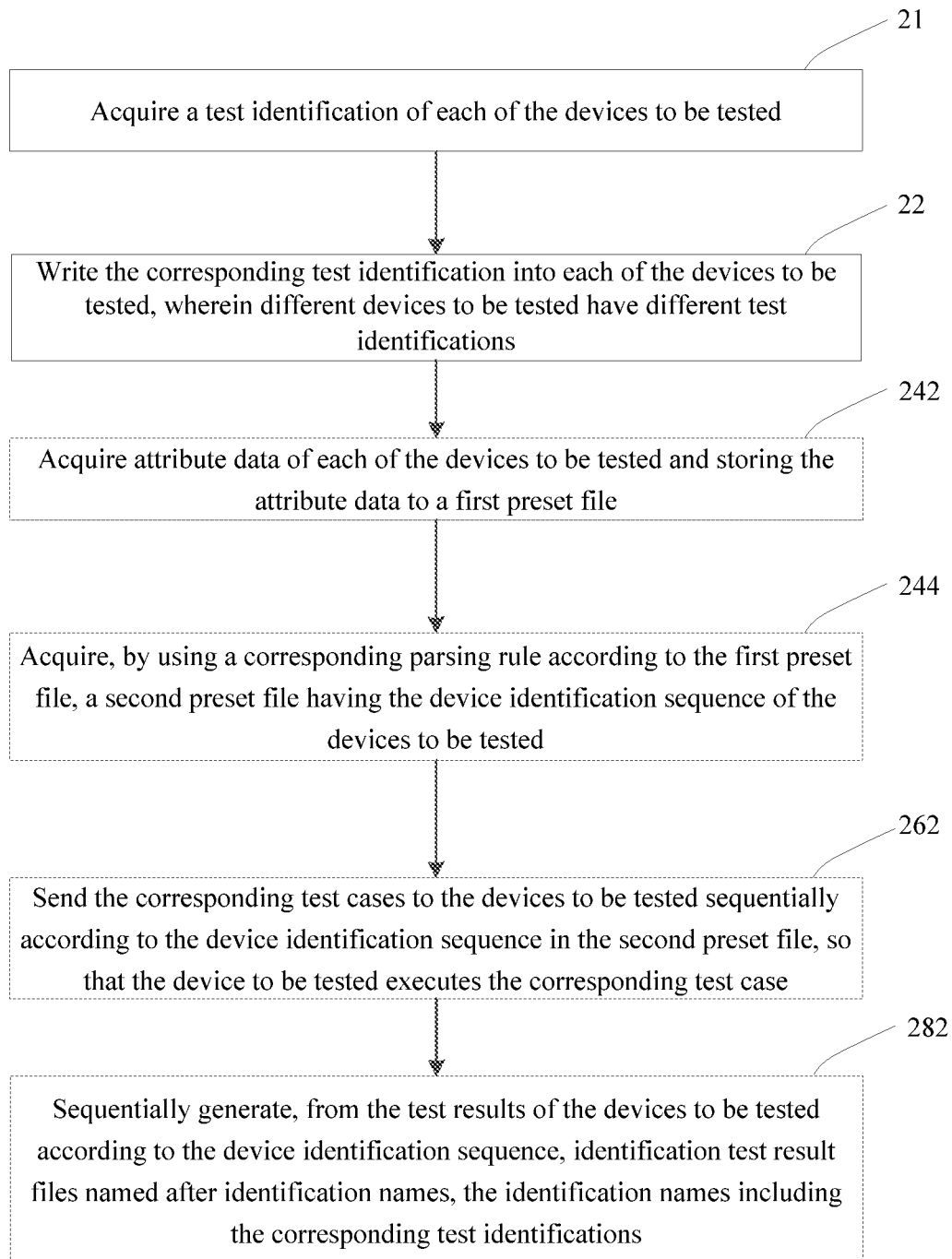
FIG. 6 is a schematic flowchart of a method for batch testing device according to a sixth embodiment of the present application.

Further, referring to FIG. 6, in one embodiment of the present application, the step of acquiring a test result for each of the devices to be tested includes the following step.

Step 282, identification test result files named after identification names are sequentially generated from the test results of the devices to be tested according to the device identification sequence, the identification names including the corresponding test identifications.

As an example, still referring to FIG. 1 and FIG. 6, after the corresponding test cases are sent to the devices to be tested 10$i$ sequentially according to the device identification sequence in the second preset file, each of the devices to be tested 10$i$ executes the corresponding test case and generates a corresponding test result. The test identification of each of the devices to be tested 10$i$ may be acquired through a second view command, and then identification test result files named after identification names are sequentially generated from the test results of the devices to be tested 10$i$ according to the device identification sequence, the identification names including the corresponding test identifications. The main control device 201 installed with an android system may acquire the test identification hostname_i of each of the devices to be tested 10$i$ through an adbshell command, where i is a positive integer greater than or equal to 2, and then sequentially generate, from the test results of the devices to be tested 10$i$ according to the device identification sequence, identification test result files named after identification names, wherein the identification names may include the corresponding test identifications, to effectively avoid confusion of test results for different devices to be tested and realize batch testing on a plurality of devices to be tested.

Figure 7:
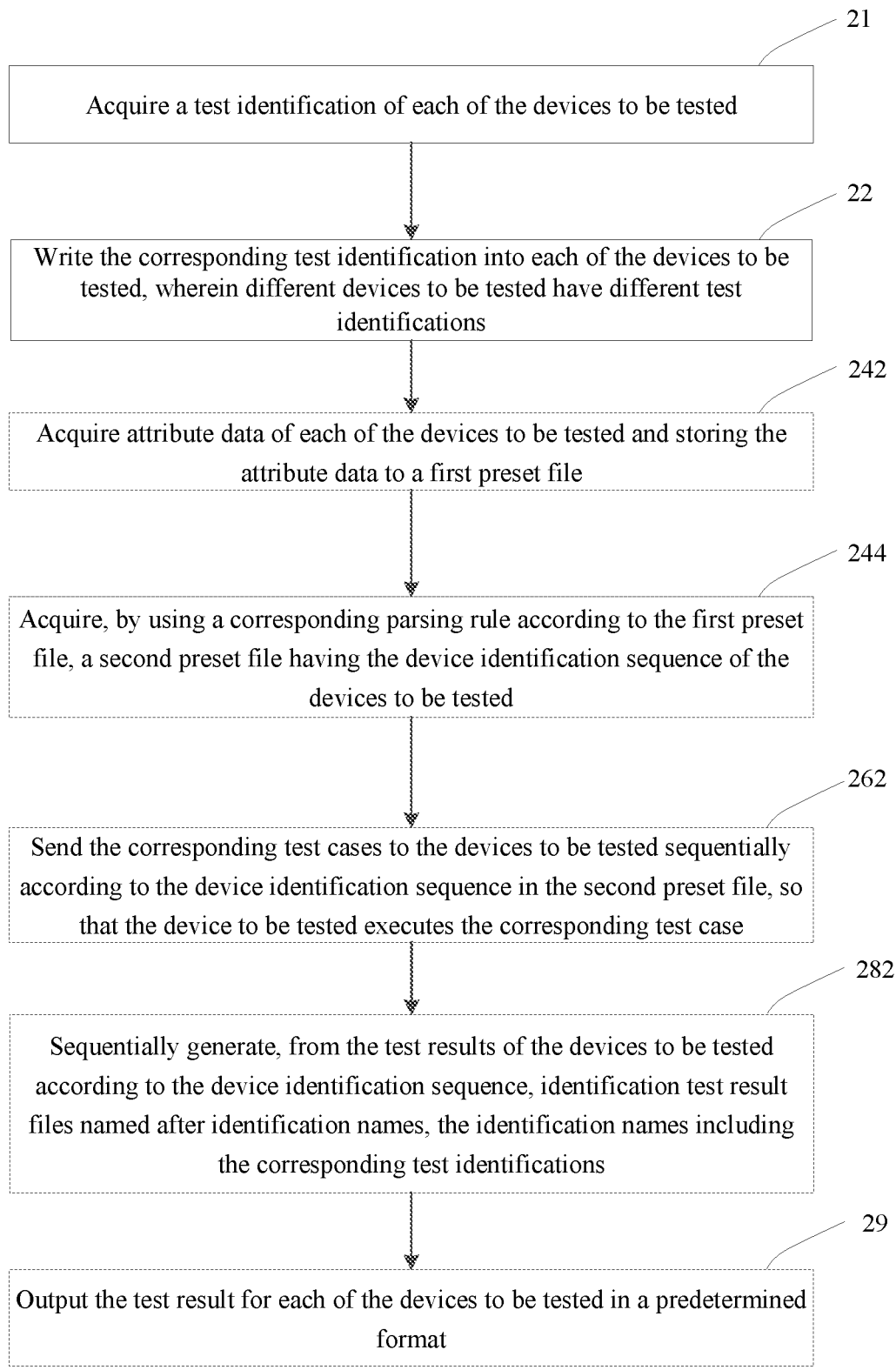
FIG. 7 is a schematic flowchart of a method for batch testing device according to a seventh embodiment of the present application.

Further, referring to FIG. 7, in one embodiment of the present application, the method for batch testing device further includes the following step.

Step 29, the test result for each of the devices to be tested is outputted in a predetermined format.

As an example, still referring to FIG. 7, after the identification test result files named after identification names are generated, wherein the identification names include the corresponding test identifications, the test result for each of the devices to be tested is outputted in a predetermined format, to facilitate the user to acquire a desired test result directly.

Figure 8:
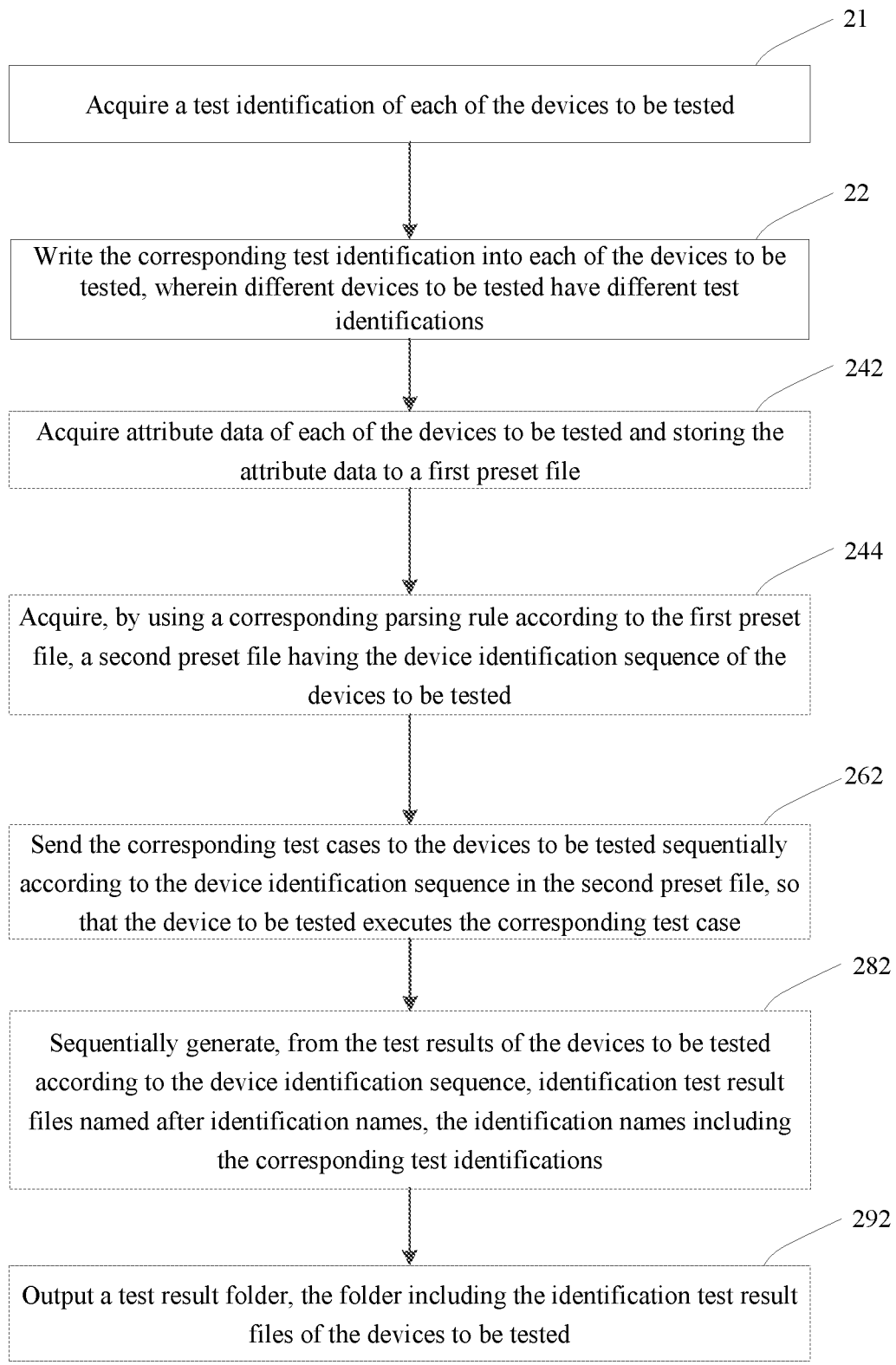
FIG. 8 is a schematic flowchart of a method for batch testing device according to an eighth embodiment of the present application.

Further, referring to FIG. 8, in one embodiment of the present application, the step of outputting the test result for each of the devices to be tested in a predetermined format includes the following step.

Step 292, a test result folder is outputted, the folder including the identification test result files of the devices to be tested.

Direct output of the test result folder including the identification test result files of the devices to be tested facilitates the user to view the test results directly through the test result folder and also facilitates the user to copy, analyze, process, transform, propagate or save the test results.

It should be understood that, although the steps in the flowcharts of FIG. 2 to FIG. 8 are displayed in sequence as indicated by the arrows, the steps are not necessarily performed in the order indicated by the arrows. Unless otherwise clearly specified herein, the steps are performed without any strict sequence limitation, and may be performed in other orders. In addition, at least some steps in FIG. 2 to FIG. 8 may include a plurality of sub-steps or a plurality of stages, and these sub-steps or stages are not necessarily performed at a same moment, and may be performed at different moments. The sub-steps or stages are not necessarily performed in sequence, and the sub-steps or stages and at least some of other steps or sub-steps or stages of other steps may be performed in turn or alternately.

Figure 9:
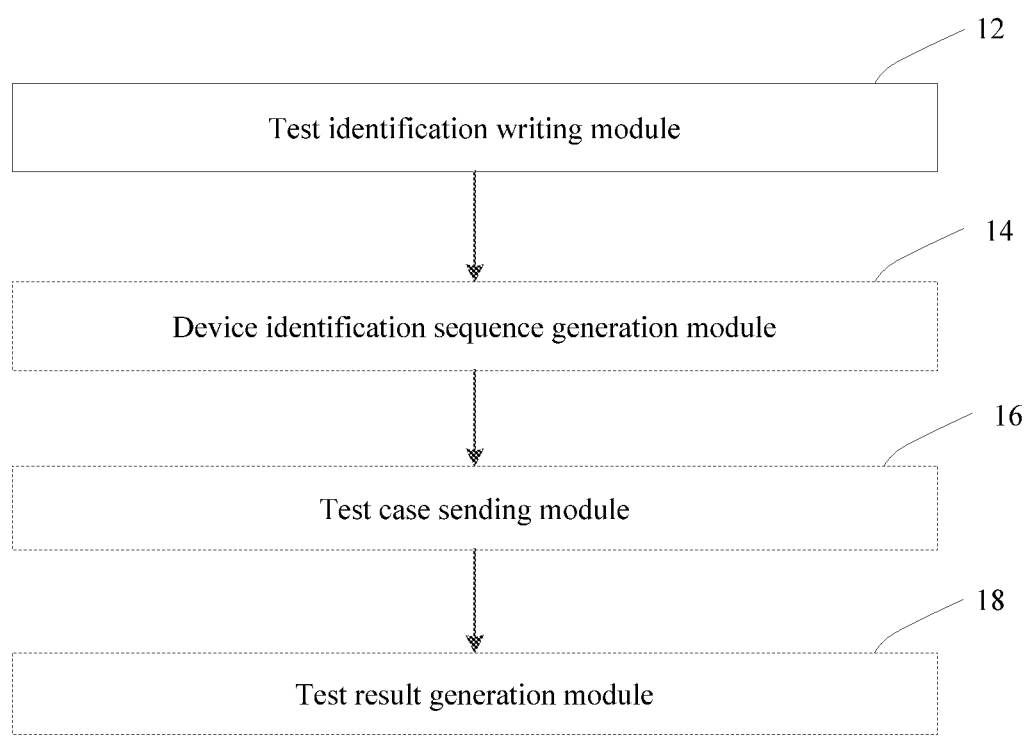
FIG. 9 is a structural block diagram of device batch testing according to a ninth embodiment of the present application.

Further, referring to FIG. 9, in one embodiment of the present application, a device batch testing apparatus is provided, for batch testing of a plurality of devices to be tested. The apparatus includes: a test identification writing module 12, a device identification sequence generation module 14, a test case sending module 16 and a test result generation module 18. The test identification writing module 12 is configured to write a corresponding test identification into each of the devices to be tested, wherein different devices to be tested have different test identifications. The device identification sequence generation module 14 is configured to acquire a device identification of each of the devices to be tested and generate a device identification sequence. The test case sending module 16 is configured to send corresponding test cases to the devices to be tested sequentially according to the device identification sequence, so that each of the devices to be tested executes the corresponding test case. The test result generation module 18 is configured to generate a test result for each of the devices to be tested, the test result corresponding to the corresponding test identification.

Specifically, still referring to FIG. 9, the test identification writing module 12 writes a corresponding test identification into each of the devices to be tested, the device identification sequence generation module 14 acquires a device identification of each of the devices to be tested and generates a device identification sequence, and the test case sending module 16 sends corresponding test cases to the devices to be tested sequentially according to the device identification sequence, so that each of the devices to be tested executes the corresponding test case, the test cases are compiled according to test requirements under a same batch test automation framework, and at least two devices to be tested correspond to different test cases, so as to acquire, based on the test result generation module 18, a test result of each of the devices to be tested including the corresponding test identification, which efficiently tests devices in batches to effectively improve supply efficiency and supply quality of device products. In the present application, device identifications of devices to be tested are used as a bridge, a correspondence between test results of the devices to be tested and test identifications written into the devices to be tested is established, and the test results corresponding to the corresponding test identifications are outputted, which has low test costs, high efficiency and good portability.

Figure 10:
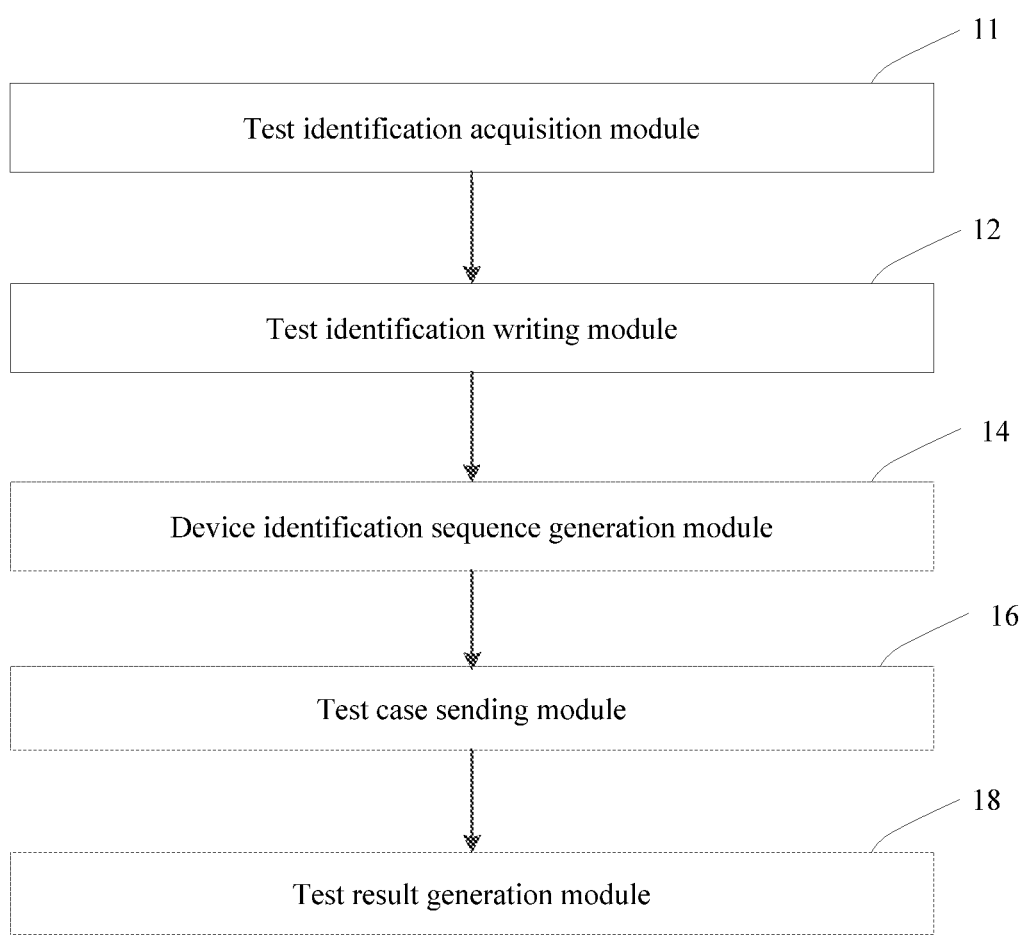
FIG. 10 is a structural block diagram of device batch testing according to a tenth embodiment of the present application.

Further, referring to FIG. 10, in one embodiment of the present application, the device batch testing apparatus further includes a test identification acquisition module 11 configured to acquire the test identification of each of the devices to be tested. The test identification is a user-defined test identification. Different devices to be tested have different test identifications, the test identification may be a user-defined test identification, and the test identification may be used as a dedicated test name of the device to be tested and may include one or more of a character, a number, a letter and the like. A corresponding test identification is written into each of the devices to be tested, so as to bind the written test identification to the device to be tested as a fixed number of the device to be tested, making it easy to acquire the fixed number bound to each of the devices to be tested to acquire a test result corresponding to the fixed number, which avoids confusion of test results for different devices to be tested and realizes batch testing on a plurality of devices to be tested.

Figure 11:
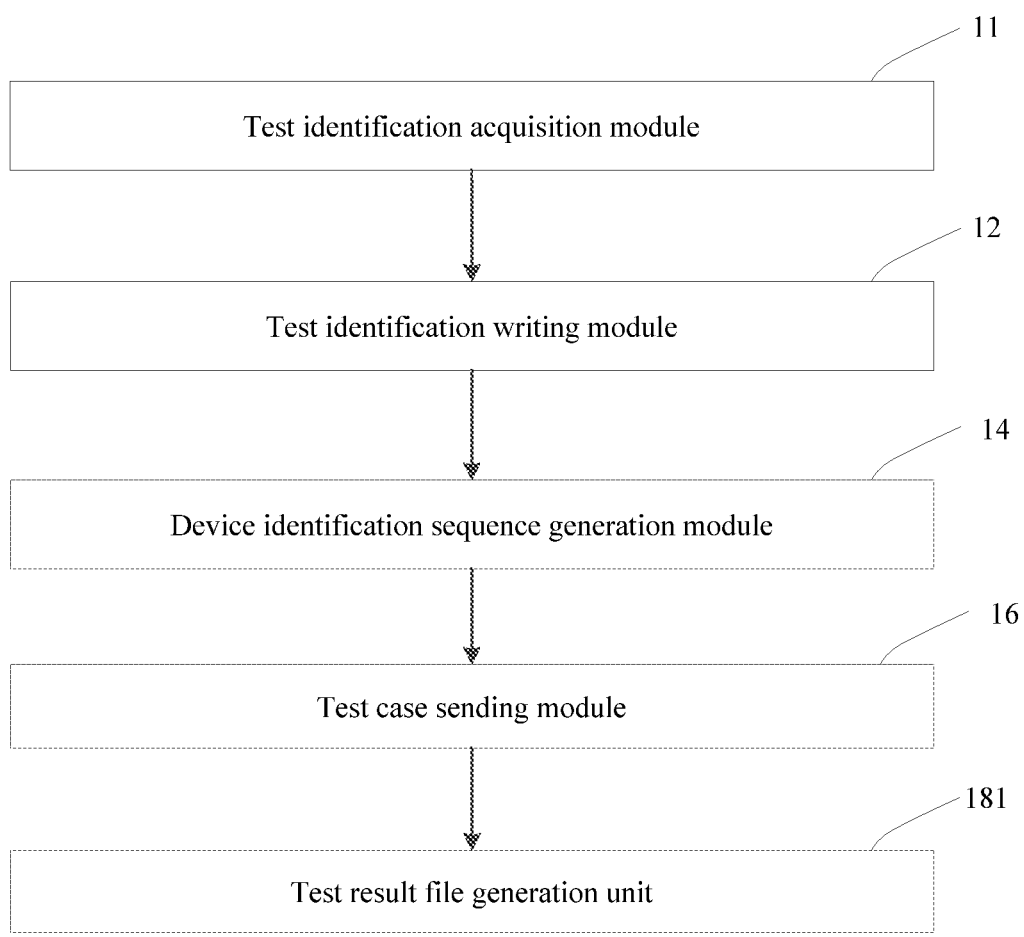
FIG. 11 is a structural block diagram of device batch testing according to an eleventh embodiment of the present application.

Further, referring to FIG. 11, in one embodiment of the present application, the test result generation module 18 includes a test result file generation unit 181 configured to sequentially generate, from the test results of the devices to be tested according to the device identification sequence, identification test result files named after identification names, the identification names including the corresponding test identifications, so as to directly output the test result folder including the identification test result files of the devices to be tested to facilitate the user to view the test results directly through the test result folder and also facilitate the user to copy, analyze, process, transform, propagate or save the test results.

In one embodiment of the present application, the device to be tested includes a memory chip, for example, a DRAM chip.

The modules in the multi-device batch testing apparatus may be entirely or partially implemented by using software, hardware, or a combination thereof. The above modules may be built in or independent of a processor of a computer device in a hardware form, or may be stored in a memory of the computer device in a software form, so that the processor invokes and performs an operation corresponding to each of the above modules.

Further, in one embodiment of the present application, a computer device is provided. The computer device may be a terminal, and its internal structure may be shown in FIG. 12. The computer device includes a processor, a memory, a communication interface, a display screen and an input apparatus that are connected through a system bus. The processor of the computer device is configured to provide computing and control capabilities. The memory of the computer device includes a non-volatile storage medium and an internal memory. The non-volatile storage medium stores an operating system and a computer program. The computer program implements a method for batch testing device when executed by the processor. The display screen of the computer device may be a liquid crystal display screen or an electronic ink display screen. The input apparatus of the computer device may be a touch layer covering the display screen, or may be a key, a trackball, or a touchpad disposed on a housing of the computer device, or may be an external keyboard, a touchpad, a mouse, or the like.

Figure 12:
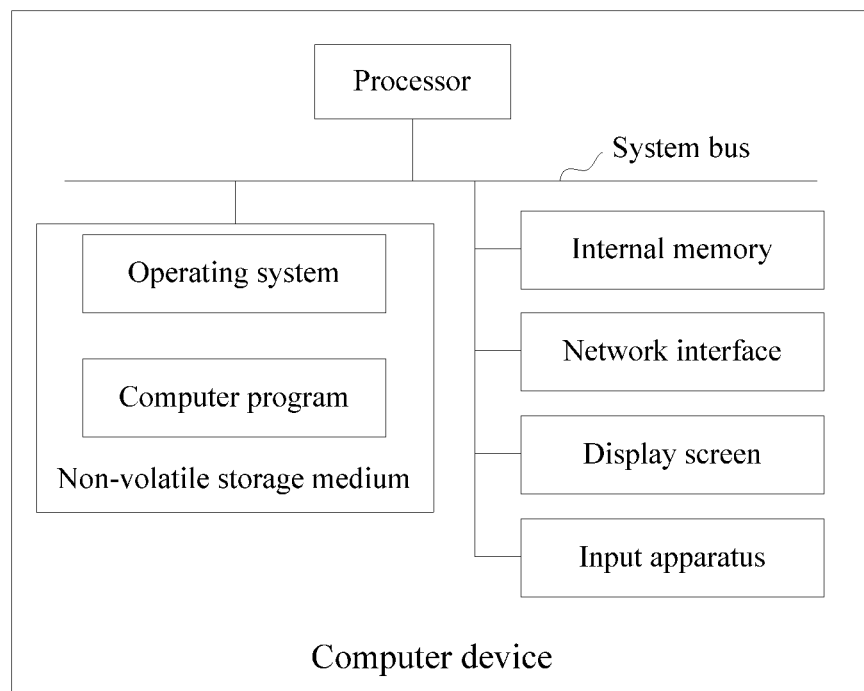
FIG. 12 is a schematic structural diagram of a computer device according to a twelfth embodiment of the present application.

Those skilled in the art may understand that a structure shown in FIG. 12 is only a block diagram of some structures related to the solution of the present application and constitutes no limitation on the computer device to which the solution of the present application is applied. Specifically, the computer device may include more or fewer components than those shown in the drawings, or some components may be combined, or a different component deployment may be used.

In one embodiment of the present application, a computer device is provided, including a memory, a processor and a computer program stored on the memory and runnable on the processor. When the processor executes the computer program, the following steps are performed:
    writing a corresponding test identification into each of the devices to be tested, wherein different devices to be tested have different test identifications;
    acquiring a device identification of each of the devices to be tested and generating a device identification sequence;
    sending corresponding test cases to the devices to be tested sequentially according to the device identification sequence, so that each of the devices to be tested executes the corresponding test case; and
    generating a test result for each of the devices to be tested, the test result corresponding to the corresponding test identification.

In one embodiment of the present application, when the processor executes the computer program, the following steps are also performed:
    acquiring the test identification of each of the devices to be tested;
    writing a corresponding test identification into each of the devices to be tested, wherein different devices to be tested have different test identifications;
    acquiring a device identification of each of the devices to be tested and generating a device identification sequence;
    sending corresponding test cases to the devices to be tested sequentially according to the device identification sequence, so that each of the devices to be tested executes the corresponding test case; and
    generating a test result for each of the devices to be tested, the test result corresponding to the corresponding test identification.

In one embodiment of the present application, when the processor executes the computer program, the following steps are also performed:
    acquiring the test identification of each of the devices to be tested;
    writing a corresponding test identification into each of the devices to be tested, wherein different devices to be tested have different test identifications;
    acquiring attribute data of each of the devices to be tested and storing the attribute data to a first preset file;
    acquiring, by using a corresponding parsing rule according to the first preset file, a second preset file having the device identification sequence of the devices to be tested;
    sending corresponding test cases to the devices to be tested sequentially according to the device identification sequence, so that each of the devices to be tested executes the corresponding test case; and
    generating a test result for each of the devices to be tested, the test result corresponding to the corresponding test identification.

In one embodiment of the present application, when the processor executes the computer program, the following steps are also performed:
    acquiring the test identification of each of the devices to be tested;
    writing a corresponding test identification into each of the devices to be tested, wherein different devices to be tested have different test identifications;
    acquiring attribute data of each of the devices to be tested and storing the attribute data to a first preset file;
    acquiring, by using a corresponding parsing rule according to the first preset file, a second preset file having the device identification sequence of the devices to be tested;
    sending the corresponding test cases to the devices to be tested sequentially according to the device identification sequence in the second preset file; and
    generating a test result for each of the devices to be tested, the test result corresponding to the corresponding test identification.

In one embodiment of the present application, when the processor executes the computer program, the following steps are also performed:
    acquiring the test identification of each of the devices to be tested;

writing a corresponding test identification into each of the devices to be tested, wherein different devices to be tested have different test identifications;

acquiring attribute data of each of the devices to be tested and storing the attribute data to a first preset file;

acquiring, by using a corresponding parsing rule according to the first preset file, a second preset file having the device identification sequence of the devices to be tested;

sending corresponding test cases to the devices to be tested sequentially according to the device identification sequence in the second preset file, so that each of the devices to be tested executes the corresponding test case;

generating a test result for each of the devices to be tested, the test result corresponding to the corresponding test identification; and outputting the test result for each of the devices to be tested in a predetermined format.

In one embodiment of the present application, when the processor executes the computer program, the following steps are also performed:

acquiring the test identification of each of the devices to be tested;

writing a corresponding test identification into each of the devices to be tested, wherein different devices to be tested have different test identifications;

acquiring attribute data of each of the devices to be tested and storing the attribute data to a first preset file;

acquiring, by using a corresponding parsing rule according to the first preset file, a second preset file having the device identification sequence of the devices to be tested;

sending corresponding test cases to the devices to be tested sequentially according to the device identification sequence in the second preset file, so that each of the devices to be tested executes the corresponding test case;

generating a test result for each of the devices to be tested, the test result corresponding to the corresponding test identification; and outputting a test result folder, the folder including the identification test result files of the devices to be tested.

In one embodiment of the present application, a computer-readable storage medium is provided, having a computer program stored thereon. The computer program, when executed by a processor, implements steps of the method for batch testing device according to any one of the embodiments of the present application.

Specific limitations on the computer device can be obtained with reference to the limitations on the computer-readable storage medium hereinabove, and are not described in detail herein.

Those of ordinary skill in the art may understand that all or some procedures in the methods in the foregoing embodiments may be implemented by a computer-readable instruction instructing related hardware, the computer program may be stored in a non-volatile computer-readable storage medium, and when the computer program is executed, the procedures in the foregoing method embodiments may be implemented. Any reference to a memory, a storage, a database, or other media used in the embodiments according to the present application may include a non-volatile and/or volatile memory. The non-volatile memory may include a read-only memory (ROM), a programmable ROM (PROM), an electrically ROM (EPROM), an electrically erasable programmable ROM (EEPROM), or a flash memory. The volatile memory may include a random access memory (RAM) or an external high-speed cache memory. By way of illustration instead of limitation, the RAM is available in a variety of forms, such as a static RAM (SRAM), a dynamic RAM (DRAM), a synchronous DRAM (SDRAM), a dual data rate SDRAM (DDRSDRAM), an enhanced SDRAM (ESDRAM), a Synchlink DRAM (SLDRAM), a Rambus Direct RAM (RDRAM), a direct memory bus dynamic RAM (DRDRAM), a memory bus dynamic RAM (RDRAM), and the like.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present application, which are described specifically and in detail, and therefore cannot be construed as a limitation on the patent scope of the present application. It should be pointed out that those of ordinary skill in the art may also make several changes and improvements without departing from the ideas of the present application, all of which fall within the protection scope of the present application. Therefore, the patent protection scope of the present application shall be subject to the appended claims.

What is claimed is:

1. A method for a batch testing device, for batch testing of a plurality of devices to be tested, the method comprising:

writing a corresponding test identification into each of the devices to be tested, wherein different devices of the devices to be tested have different test identifications;

acquiring a device identification of each of the devices to be tested and generating a device identification sequence;

sending corresponding test cases to the devices to be tested sequentially according to the device identification sequence, so that each of the devices to be tested executes the corresponding test case; and generating a test result for each of the devices to be tested, the test result corresponding to the corresponding test identification, which comprises:

acquiring test results in one-to-one correspondence to the device identification sequence and acquiring the test identifications in one-to-one correspondence to the device identification sequence; and sequentially generating, from the test results of the devices to be tested according to the device identification sequence, identification test result files named after identification names, the identification names comprising the corresponding test identifications, so as to establish a mapping relationship between the test results of the devices to be tested and the corresponding test identifications.

2. The method according to claim 1, further comprising: prior to the writing a corresponding test identification into each of the devices to be tested, acquiring the corresponding test identification of each of the devices to be tested.

3. The method according to claim 2, wherein the corresponding test identification is a user-defined test identification.

4. The method according to claim 1, wherein the acquiring a device identification of each of the devices to be tested and generating a device identification sequence comprises:

acquiring attribute data of each of the devices to be tested and storing the attribute data to a first preset file; and acquiring, by using a corresponding parsing rule according to the first preset file, a second preset file having the device identification sequence of each of the devices to be tested.

5. The method according to claim 4, wherein the sending corresponding test cases to the devices to be tested sequentially according to the device identification sequence comprises:
sending the corresponding test cases to the devices to be tested sequentially according to the device identification sequence in the second preset file.

6. The method according to claim 1, further comprising:
after the generating, from the test results of the devices to be tested according to the device identification sequence, identification test result files named after identification names, outputting the test result for each of the devices to be tested in a predetermined format.

7. The method according to claim 6, wherein the outputting the test result for each of the devices to be tested in a predetermined format comprises:

outputting a test result folder, the test result folder comprising the identification test result files of the devices to be tested.

8. The method according to claim 1, wherein the corresponding test cases are compiled according to test requirements under a same batch test automation framework.

9. The method according to claim 1, wherein the devices to be tested comprise a memory chip.

10. The method according to claim 9, wherein the memory chip comprises a dynamic random access memory chip.

11. The method according to claim 1, wherein at least two of the devices to be tested correspond to different test cases.

12. A computer device, comprising a memory and a processor, the memory storing a computer program runnable on the processor, wherein steps of the method according to claim 1 are implemented when the processor executes the computer program.

* * * * *